United States Patent [19]

Schmidt et al.

[11] Patent Number: 5,241,215

[45] Date of Patent: Aug. 31, 1993

[54] METHOD AND APPARATUS FOR PROVIDING NOVEL HYBRID CIRCUIT ASSEMBLY CARRIER BRACKET

[75] Inventors: Detlef W. Schmidt, Schaumburg; John Lubbe, Chicago, both of Ill.

[73] Assignee: Motorola, Inc., Schaumburg, Ill.

[21] Appl. No.: 830,001

[22] Filed: Jan. 31, 1992

[51] Int. Cl.⁵ .................... H01L 23/48; H01L 23/02; H01L 23/16; H01L 23/42
[52] U.S. Cl. ................................. 257/718; 257/723; 257/727; 257/735
[58] Field of Search ............... 357/68, 74, 75, 79, 357/81; 257/718, 723, 727, 735

Primary Examiner—Mark V. Prenty
Attorney, Agent, or Firm—Darleen J. Stockley

[57] ABSTRACT

An apparatus and method (200) for providing a hybrid circuit assembly carrier bracket are included wherein the bracket is constructed and arranged to provide controlled placement of at least a first power transistor (124, 126) and to provide a highly efficient thermal transfer and dissipating arrangement. The bracket is constructed and arranged to provide for placement of at least a first substrate for a hybrid circuit assembly thereon, and includes at least a first power transistor aperture (120, 122) with at least two bracket projections (146, 148) for permitting placement of said transistor on plural electrical contacts (104, 106). The heat generated by components on the circuit board(s) is transferred and dissipated substantially by biasing at least one bracket projection member resiliently against a heat sink (108, 110, 112, 114, 116, 118).

16 Claims, 2 Drawing Sheets

METHOD AND APPARATUS FOR PROVIDING NOVEL HYBRID CIRCUIT ASSEMBLY CARRIER BRACKET

FIELD OF THE INVENTION

The present invention relates generally to hybrid circuit assembly brackets and more particularly, to thermally dissipative hybrid circuit assembly brackets.

BACKGROUND

Certain problems are typically associated with design and assembly of brackets for hybrid circuits that use power transistors which are solder reflowed to common substrates. Many of these assemblies generate a considerable amount of power, and thus require brackets that have good heat sinking characteristics. Power transistors are typically placed in a depression on a bracket such that side transistor leads are located at a desired height for allowing solder reflow of said leads to selected hybrid circuits. Thus, correct placement of the power transistors generally requires that a height from a bottom of a transistor lead to a bottom of a transistor flange be within a very close degree of precision of a selected measurement in order to assure satisfactory electrical connection of the power transistor upon solder reflow to a substrate. Milling of a bottom of the transistor flange is costly and somewhat unreliable.

It is also desirable to reduce assembly fixtures required for electrical attachment of the power transistors, thus providing a more easily assembled and more maintenance free assembly.

There is a need for an efficient thermally dissipative carrier bracket for a hybrid circuit assembly that also minimizes power transistor assembly fixtures.

SUMMARY OF THE INVENTION

A carrier bracket for at least a first substrate for a first hybrid circuit assembly having transistor contact areas and at least a first power transistor that has at least a bottom flange and a plurality of leads and a method for providing the bracket are set forth. The bracket comprises a support unit for supporting and positioning at least a first substrate for a hybrid circuit assembly, and at least a first heat sink derived from the support unit. The support unit includes at least a first aperture for guiding placement of the bottom flange of the transistor such that the transistor occupies the aperture, thus providing heat sinking capability and permitting suspension of the transistor from, and solderable connection to, transistor contact areas of the assembly utilizing the transistor leads.

BRIEF DESCRIPTIONS OF THE DRAWINGS

DETAILED DESCRIPTION OF A PREFERRED EMBODIMENT

Figure 1:
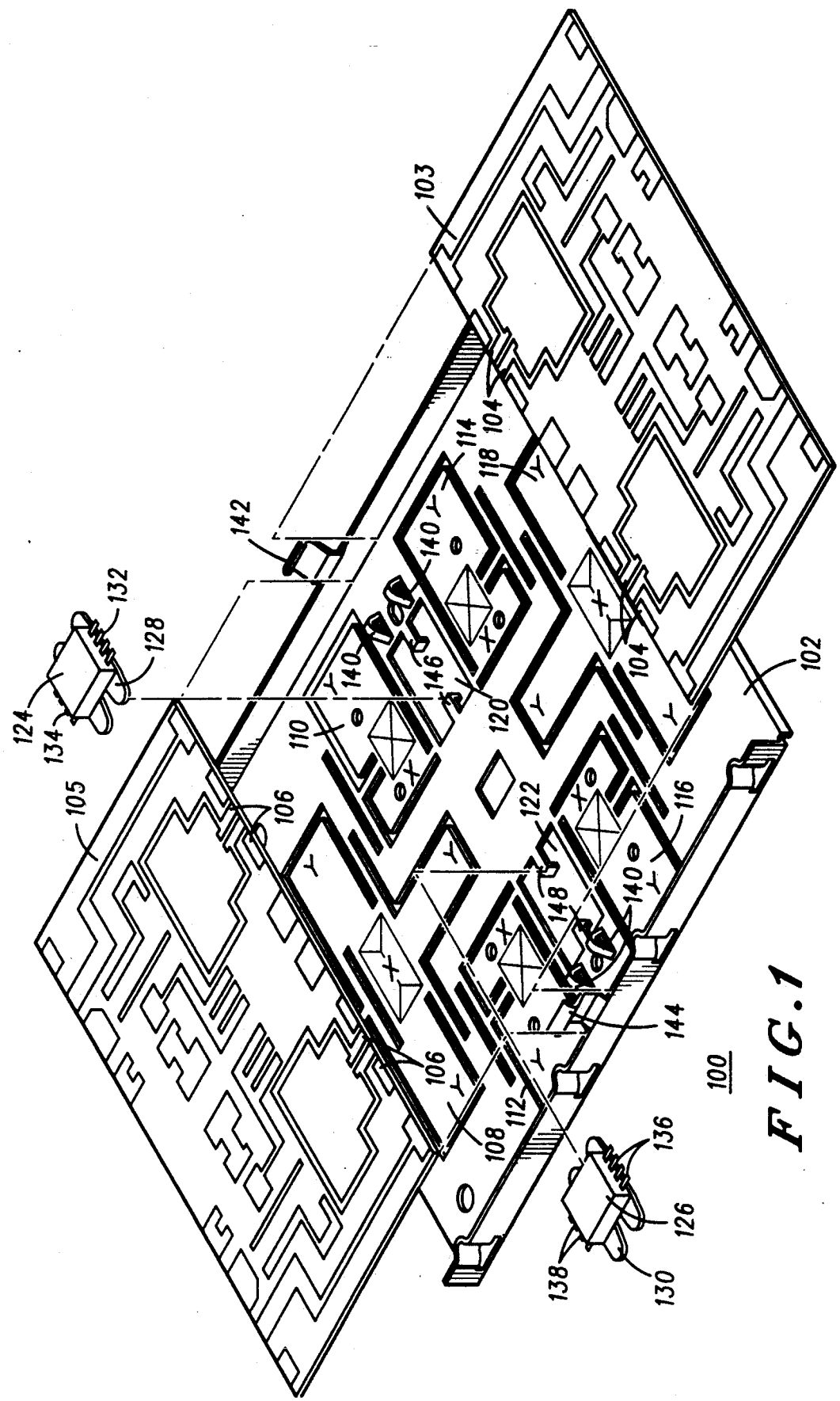
FIG. 1 is a front, top, and right perspective view of an exemplary embodiment of a carrier bracket for at least first substrate for a first hybrid circuit assembly and at least a first transistor in accordance with the present invention.

FIG. 1, numeral 100, is a front, top, and right perspective view of an exemplary embodiment of a carrier bracket for at least a first substrate for a first hybrid circuit assembly in accordance with the present invention, constructed and arranged to provide efficient thermal dissipation and to minimize power transistor assembly fixtures. The carrier bracket is utilized to support at least a first substrate (103, 105) for a first hybrid circuit assembly having transistor contact areas (104, 106) and at least a first power transistor (124, 126) that has at least a bottom flange (128, 130) and a plurality of leads (132, 134, 136, 138). The bracket comprises a support unit (102) for supporting and positioning at least a first hybrid circuit assembly and has at least a first heat sink (108, 110, 112, 114, 116, 118), described in more detail below, derived from the support unit.

The support unit (102) includes at least a first aperture (120, 122) for guiding placement of the bottom flange (128, 130) of the transistor such that the transistor (124, 126) occupies the aperture (120, 122). Heat sinking capability is provided in that the bottom flange (128, 130) of the transistor is permitted to extend below the support unit (102), permitting contact with a selected heat sink. That is, where selected, the transistor (124, 126) is allowed to directly rest on a heat sink below the support unit. Use of the aperture (120, 122) to position the transistor permits suspension of the transistor (124, 126) from, and solderable connection to, transistor contact areas (104, 106) of the assembly utilizing the transistor leads (132, 134, 136, 138).

The support unit (102) comprises a substantially planar conductive sheet having further apertures in an open configuration. The open configuration permits formation of a plurality of heat sinks (108, 110, 112, 114, 116, 118) from the support unit (102), each heat sink being formed by placing sets of at least two apertures, typically narrow linear apertures in proximity such that said apertures enclose all but a minimal portion of a selected area of the supporting unit (102), leaving narrow portions of the supporting unit (102) connecting the enclosed area, the heat sink (108, 110, 112, 114, 116, 118). Thus, the heat sinks are similar to islands derived from the substrate unit (102) that are connected to the substrate unit by at least a first peninsula (narrow portion of the substrate). Further, each heat sink (108, 110, 112, 114, 116, 118) may be adapted, typically by bending to form heat transfer tabs that extend into a plane below that of the planar conductive sheet for facilitating thermal dissipation. Thus, heat from the substrate is transferred to the bracket heat sinks (at location Xs), and then to the heat transfer tabs of the heat sinks (at location Ys), providing stress relief to selected areas (at location Xs) of the heat sinks. Soldering the substrate to the stress relieved areas (at location Xs) allows for thermal expansion and contraction, minimizing stress on those solder joints. Thus, adaption of the heat sinks comprises substantially utilizing a first portion (at location Xs) of each heat sink in the plane of the conductive sheet to provide thermal contact with the substrate and, where selected, to provide a stress-relieved position for establishing a substrate-heat sink solder joint. Further, a second portion (at location Ys) of each heat sink, wherein each second portion extends into a plane below that of the planar conductive sheet, for at least facilitating heat transfer away from the first portion (at location Xs).

The planar conductive sheet is selected from a material selected from the group consisting of metals, and is typically copper.

The planar conductive sheet further includes at least a first substrate stop (140) for securing placement of at least the first hybrid circuit assembly. A substrate stop is a projection that allows placement of a hybrid circuit assembly on the planar conductive sheet such that said assembly tends to remain in a particular location. The at least first substrate stop is typically one of: press-formed from the planar conductive sheet, formed by bending the planar conductive sheet, and shaped by an aperture in the planar conductive sheet and is positioned by providing a bend at the base of the substrate stop such that the stop projects above the plane of the planar conductive sheet.

The bracket may be selected to provide for positioning of further devices. Thus, typically, where at least two substrate stops are formed substantially on opposing sides of the planar conductive sheet by bending the planar conductive sheet, the bent portions of the planar conductive sheet are further shaped to form snap-in clamps (142, 144). Such snap-in clamps typically are formed by three bends, giving a v shaped notch appearance.

Guidance is provided for placement of the transistor (124, 126) where the at least first aperture (120, 122) for guiding placement of the bottom flange (128, 130) of the transistor is shaped to provide at least two projections (146, 148) from the bracket. Where selected, to provide further control of placement of the transistor, at least two projections are bent into a plane different from that of the planar conductive sheet as transistor guides.

Figure 2:
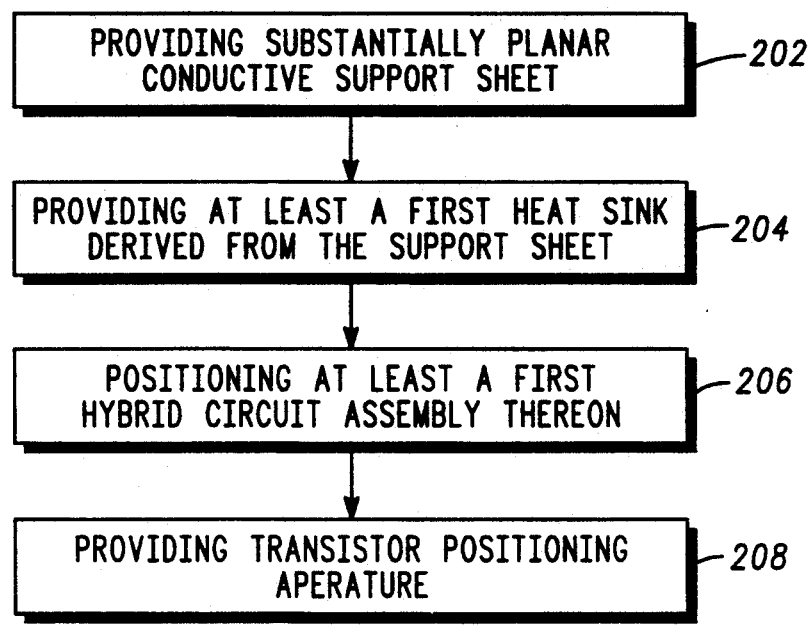
FIG. 2 is a flow chart setting forth steps in accordance with the method of the present invention.

FIG. 2, numeral 200, illustrates steps for a method for forming a carrier bracket for at least a first substrate for a first hybrid circuit assembly having transistor contact areas and at least a first power transistor that has at least a bottom flange and a plurality of leads in accordance with the present invention. The method comprises the steps of: providing a substantially planar conductive support sheet (typically a copper sheet)(202), providing at least a first heat sink derived from the support sheet (204), positioning at least a first hybrid circuit assembly thereon (206), and providing at least a first transistor positioning aperture (208) for guiding placement of the bottom flange of the transistor such that the transistor occupies the aperture, provides heat sinking capability and permits suspension of the transistor from, and solderable connection to, transistor contact areas of the assembly utilizing the transistor leads.

The method may be further selected to including the step of providing apertures in the substantially planar conductive in an open configuration that permit formation of a plurality of heat sinks from the metal sheet such that:

each heat sink is attached to the sheet by at least a first portion of the sheet, and each heat sink may be adapted to extend into a plane below that of the sheet for facilitating thermal dissipation.

The method may be further selected to include the step of providing at least a first substrate stop for securing placement of at least the first hybrid circuit assembly, described more fully above.

Also, the method may be further selected to include the step of shaping the at least first aperture for guiding placement of the bottom flange of the transistor to provide at least two projections from the bracket, described more fully above.

Although a description of an embodiment of the present invention has been described and shown in the drawings, the scope of the invention is defined by the claims which follow.

We claim:

1. A carrier bracket for at least a first substrate for a first hybrid circuit assembly having transistor contact areas and at least a first power transistor that has at least a bottom flange and a plurality of leads, comprising:

support means for supporting and positioning at least a first substrate for a first hybrid circuit assembly, and at least a first heat sink comprising a projection of a portion of the support means, the projection being formed by aperture(s) in said support means and arranged to extend away from the support means, wherein the support means includes at least a first aperture for guiding placement of the bottom flange of the transistor such that the transistor occupies the aperture with the bottom flange protruding beneath the support means, thus providing heat sinking capability and permitting suspension of the transistor from, and solderable connection to, transistor contact areas of the assembly utilizing the transistor leads.

2. The bracket of claim 1 wherein the support means comprises a substantially planar conductive sheet having apertures therein that permit formation of a plurality of projections that function as a plurality of heat sinks from the conductive sheet such that:

each heat sink is attached to the support means by at least a first portion of the support means, and each heat sink may be adapted to extend into a plane below that of the planar conductive sheet for facilitating thermal dissipation.

3. The bracket of claim 2 wherein the planar conductive sheet comprises a metal.

4. The bracket of claim 3 wherein the metal is copper.

5. The bracket of claim 2 wherein the adaption of the heat sinks comprises substantially:

utilizing a first portion of each heat sink in the plane of the conductive sheet to provide thermal contact with the substrate and, where selected, to provide a stress-relieved position for establishing a substrate-heat sink solder joint, and utilizing at least a second portion of each heat sink, wherein each second portion extends into a plane below that of the planar conductive sheet, for at least facilitating heat transfer away from the first portion.

6. The bracket of claim 2 wherein the planar conductive sheet further includes at least a first substrate stop for securing placement of at least the first hybrid circuit assembly.

7. The bracket of claim 6 wherein the at least first substrate stop is one of:

(A) press-formed from the planar conductive sheet, (B) the substrate stop is formed by bending the planar conductive sheet, and (C) the substrate stop is shaped by an aperture in the planar conductive sheet and is positioned by providing a bend at the base of the substrate stop such that the stop projects above the plane of the planar conductive sheet.

8. The bracket of claim 7 wherein at least two substrate stops are formed substantially on opposing sides of the planar conductive sheet by bending the planar conductive sheet, the bent portions of the planar conductive sheet being further shaped to form snap-in clamps.

9. The bracket of claim 1 wherein the at least first aperture for guiding placement of the bottom flange of the transistor is shaped to provide at least two projections from the bracket.

10. The bracket of claim 9 wherein said at least two projections are bent into a plane different from that of the planar conductive sheet as transistor guides.

11. A thermally dissipative copper carrier bracket for at least a first substrate for a first hybrid circuit assembly having transistor contact areas and at least a first power transistor that has at least a bottom flange and a plurality of leads, comprising:

support means for supporting and positioning at least two substrates for hybrid circuit assemblies, comprising a substantially planar copper sheet having apertures, and a plurality of heat sinks comprising a projection of a portion of the support means, the projection being formed by aperture(s) in said support means and arranged to extend away from the support means formed utilizing a plurality of apertures therein that permit formation of the heat sinks from the planar copper sheet such that:

each heat sink is attached to the support means by at least two portions of the support means, and each heat sink may be adapted to extend into a plane below that of the planar copper sheet for facilitating thermal dissipation, wherein the support means includes at least a first aperture for guiding placement of the bottom flange of the transistor such that the transistor occupies the aperture with the bottom flange protruding beneath the support means, thus providing heat sinking capability and permitting suspension of the transistor from, and solderable connection to, transistor contact areas of the assembly utilizing the transistor leads.

12. The bracket of claim 11 wherein the adaption of the heat sinks comprises substantially:

utilizing a first portion of each heat sink in the plane of the planar copper sheet to provide thermal contact with the substrate and, where selected, to provide a stress-relieved position for establishing a substrate-heat sink solder joint, and utilizing at least a second portion of each heat sink, wherein each second portion extends into a plane below that of the planar copper sheet, for at least facilitating heat transfer away from the first portion.

13. The bracket of claim 11 wherein the planar copper sheet further includes at least a first substrate stop for securing placement of at least the first hybrid circuit assembly and wherein the at least first substrate stops is one of:

(A) press-formed from the planar copper sheet,
(B) formed by bending the planar copper sheet, and
(C) shaped by an aperture in the planar copper sheet and is positioned by providing a bend at the base of the substrate stop such that the stop projects above the plane of the planar copper sheet.

14. The bracket of claim 13 wherein, where at least two substrate stops are formed substantially on opposing sides of the planar copper sheet by bending the planar copper sheet, the bent portions of the planar copper sheet are further shaped to form snap-in clamps.

15. The bracket of claim 11 wherein the at least first aperture for guiding placement of the bottom flange of the transistor is shaped to provide at least two projections from the bracket.

16. The bracket of claim 15 wherein said at least two projections are bent into a plane different from that of the planar copper sheet as transistor guides.

* * * * *